United States Patent
Pan et al.

(10) Patent No.: US 8,643,291 B2
(45) Date of Patent: Feb. 4, 2014

(54) HIGH-VOLTAGE AC LED STRUCTURE

(75) Inventors: Ching-Jen Pan, Hsinchi County (TW); Wei-Tai Cheng, Hsinchu County (TW); Ming-Hung Chen, Hsinchu County (TW)

(73) Assignee: Helio Optoelectronics Corporation, Hsinchu County (TW)

( * ) Notice: Subject to any disclaimer, the term of this patent is extended or adjusted under 35 U.S.C. 154(b) by 163 days.

(21) Appl. No.: 13/407,398

(22) Filed: Feb. 28, 2012

(65) Prior Publication Data

US 2013/0127352 A1 May 23, 2013

(30) Foreign Application Priority Data

Nov. 17, 2011 (TW) .............................. 100142108 A

(51) Int. Cl.
*H05B 37/00* (2006.01)
(52) U.S. Cl.
USPC .......................................... 315/192; 315/193
(58) Field of Classification Search
None
See application file for complete search history.

(56) References Cited

U.S. PATENT DOCUMENTS

| | | | | |
|---|---|---|---|---|
| 5,258,629 A * | 11/1993 | Itoh et al. | .......................... | 257/88 |
| 5,952,789 A * | 9/1999 | Stewart et al. | ............... | 315/169.4 |
| 6,144,165 A * | 11/2000 | Liedenbaum | ............... | 315/169.3 |
| 6,853,151 B2 * | 2/2005 | Leong et al. | ............... | 315/185 R |
| 7,948,015 B2 * | 5/2011 | Rothberg et al. | ............. | 257/253 |
| 8,531,117 B2 * | 9/2013 | Cho et al. | ................... | 315/185 R |
| 2004/0189218 A1 * | 9/2004 | Leong et al. | ................... | 315/291 |
| 2005/0162101 A1 * | 7/2005 | Leong et al. | ................... | 315/291 |
| 2007/0228999 A1 * | 10/2007 | Kit | ................. | 315/291 |
| 2008/0211416 A1 * | 9/2008 | Negley et al. | .................. | 315/193 |
| 2008/0211421 A1 * | 9/2008 | Lee et al. | ....................... | 315/250 |
| 2009/0284161 A1 * | 11/2009 | Kumar et al. | ............. | 315/209 R |
| 2010/0201280 A1 * | 8/2010 | McKenzie et al. | ............ | 315/246 |
| 2010/0277084 A1 * | 11/2010 | Lee et al. | ...................... | 315/192 |
| 2010/0320902 A1 * | 12/2010 | Yu | .................... | 315/32 |
| 2011/0057569 A1 * | 3/2011 | Wei et al. | ...................... | 315/122 |

FOREIGN PATENT DOCUMENTS

| | | |
|---|---|---|
| TW | M354294 | 1/2009 |
| TW | M393127 | 11/2010 |

* cited by examiner

*Primary Examiner* — Crystal L Hammond
(74) *Attorney, Agent, or Firm* — Stites & Harbison PLLC; Juan Carlos A. Marquez, Esq.

(57) ABSTRACT

The present invention provides a high-voltage alternating current light-emitting diode (AC LED) structure. The high-voltage AC LED structure includes a circuit substrate and a plurality of AC LED chips. The AC LED chips each include an insulated substrate, an LED set, a first metal layer and a second metal layer. The AC LED chips manufactured by a wafer level process are coupled to the low-cost circuit substrate to produce the downsized high-voltage AC LED structure.

13 Claims, 10 Drawing Sheets

HIGH-VOLTAGE AC LED STRUCTURE

BACKGROUND OF THE INVENTION

1. Technical Field

The present invention relates to high-voltage alternating current light-emitting diode (AC LED) structures, and more particularly, to a high-voltage AC LED structure for use in illumination.

2. Description of Related Art

Taiwan utility model patent M393127 discloses an alternating current light-emitting diode device connected to an alternating current power. The alternating current light-emitting diode device essentially comprises four rectifying elements and connects to two pointing elements to thereby form an asymmetrical bridge circuit structure. The alternating current light-emitting diode device further comprises at least two light-emitting diode serial blocks connected to branch circuits of the asymmetrical bridge circuit structure, respectively, such that all or most of the light-emitting diodes of the alternating current light-emitting diode device emit light and thus are brightened up during the positive voltage half cycle and the negative voltage half cycle of an AC power source, thereby enhancing the efficiency of use of the AC power source by the alternating current light-emitting diode device.

Taiwan utility model patent M354294 discloses an alternating current light-emitting device comprising: an AC-AC transformer for converting a first AC voltage supplied by an AC Power source into a second AC voltage; an alternating current light-emitting diode module including a first set light-emitting diode die and a second set light-emitting diode die, wherein electrical conduction of the first set light-emitting diode die is rendered ON for a first duration during a positive cycle of the second AC voltage, and electrical conduction of the second set light-emitting diode die is rendered ON for a second duration during a negative cycle of the second AC voltage; and a protective unit coupled to between the AC power source and the alternating current light-emitting diode module for providing overvoltage or overcurrent protection.

According to the aforesaid prior art, the light-emitting diodes employed are mostly ordinary diodes manufactured by an ordinary non-wafer level process, and are designed in accordance with the concept of unidirectional or rectifying circuits, or use an AC transformer to perform voltage transformation. With an AC transformer being bulky, the aforesaid method not only renders the whole device bulky too, but also renders the AC transformer power-consuming. Therefore, it is imperative to manufacture a high-voltage alternating current light-emitting diode (AC LED) structure that dispenses with an AC transformer and comprises light-emitting diodes, manufactured by a wafer level process so as to meet market needs.

SUMMARY OF THE INVENTION

The present invention relates to a high-voltage alternating current light-emitting diode (AC LED) structure comprising a circuit substrate and a plurality of AC LED chips. The AC LED chips each comprise an insulated substrate, an LED set, a first metal layer, and a second metal layer. According to the present invention, the AC LED chips manufactured by a wafer level process are coupled to the low-cost circuit substrate to produce a downsized high-voltage AC LED structure.

The present invention provides a high-voltage alternating current light-emitting diode (AC LED) structure, comprising: a circuit substrate; and a plurality of AC LED chips fixed to and electrically connected to the circuit substrate and forming a series-connected circuit by means of the circuit substrate, the AC LED chips each comprising: an insulated substrate; at least one LED set having a first LED and a second LED, wherein the first LED and the second LED are disposed on the insulated substrate and insulated and separated from each other; at least one first metal layer forming a first shape layout and having a first end portion and a second end portion, the first end portion being disposed on a first transparent conductive layer of the first LED, and the second end portion being disposed on a second n-type layer of the second LED; and at least one second metal layer forming the first shape layout and having a third end portion and a fourth end portion, the third end portion being disposed on a second transparent conductive layer of the second LED, and the fourth end portion being disposed on a first n-type layer of the first LED.

Implementation of the present invention at least involves inventive steps as follows:

1. AC LED chips manufactured by a wafer level process are coupled to a low-cost circuit substrate to produce a downsized high-voltage AC LED structure.
2. A high-voltage AC LED structure is produced easily and quickly.
3. A high-voltage AC LED structure that manifests diversity can be produced.

The detailed features and advantages of the present invention will be described in detail with reference to the preferred embodiment so as to enable persons skilled in the art to gain insight into the technical disclosure of the present invention, implement the present invention accordingly, and readily understand the objectives and advantages of the present invention by perusal of the contents disclosed in the specification, the claims, and the accompanying drawings.

DETAILED DESCRIPTION OF THE EMBODIMENTS OF THE INVENTION

Figure 1A:
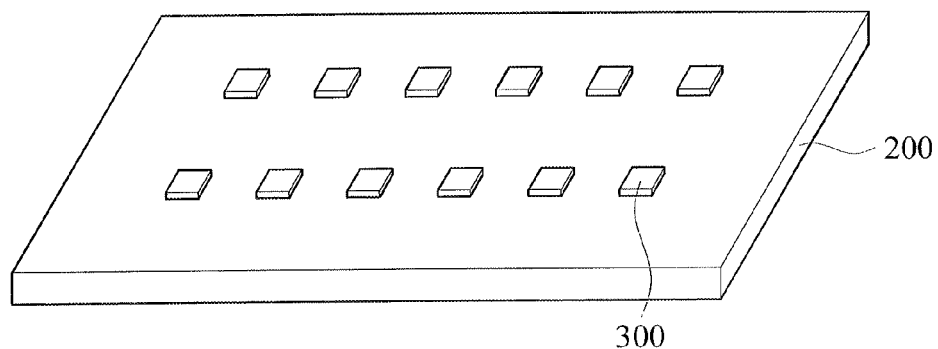
FIG. 1A is a schematic view of a high-voltage alternating current light-emitting diode (AC LED) structure according to an embodiment of the present invention.

Referring to FIG. 1A, a high-voltage alternating current light-emitting diode (AC LED) structure 100 in this embodiment comprises a circuit substrate 200 and a plurality of AC LED chips 300.

The circuit substrate 200 is an aluminum substrate or a ceramic substrate. In an embodiment where the AC LED chips 300 are coupled to the circuit substrate 200, the volume of the circuit substrate 200 is much larger than that of the LED chips 300; hence, it is feasible to allow the circuit substrate 200 to provide electrical connection for the LED chips 300 and thereby design a diversified parallel-series connected circuit, so as to produce the high-voltage AC LED structure 100 easily, quickly, and diversely.

In addition to circuit connection, the circuit substrate 200 enables heat dissipation. In an embodiment where the circuit substrate 200 is a ceramic substrate, a plurality of thermally conductive posts or a plurality of electrically conductive posts is disposed inside the ceramic substrate for transferring efficiently the heat generated by the AC LED chips 300 in operation and enabling an electrode of the AC LED chips 300 to extend to the other side of ceramic substrate smoothly.

Figure 1B:
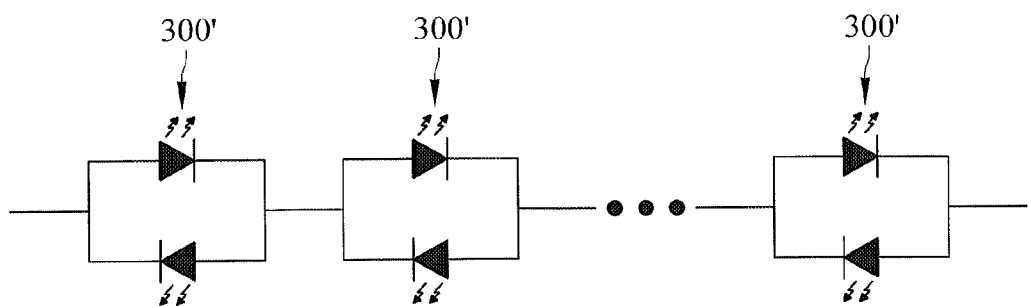
FIG. 1B is a series-connected equivalent circuit diagram according to an embodiment of the present invention.

Referring to FIG. 1B, the plurality of AC LED chips 300 is fixed to and electrically connected to the circuit substrate 200. AC LED chips 300' form a series-connected circuit 400 by means of the diverse electrical connection provided by the circuit substrate 200, thereby finalizing the high-voltage AC LED structure 100. This is the basic aspect of a series-connected circuit in this embodiment.

Figure 2A:
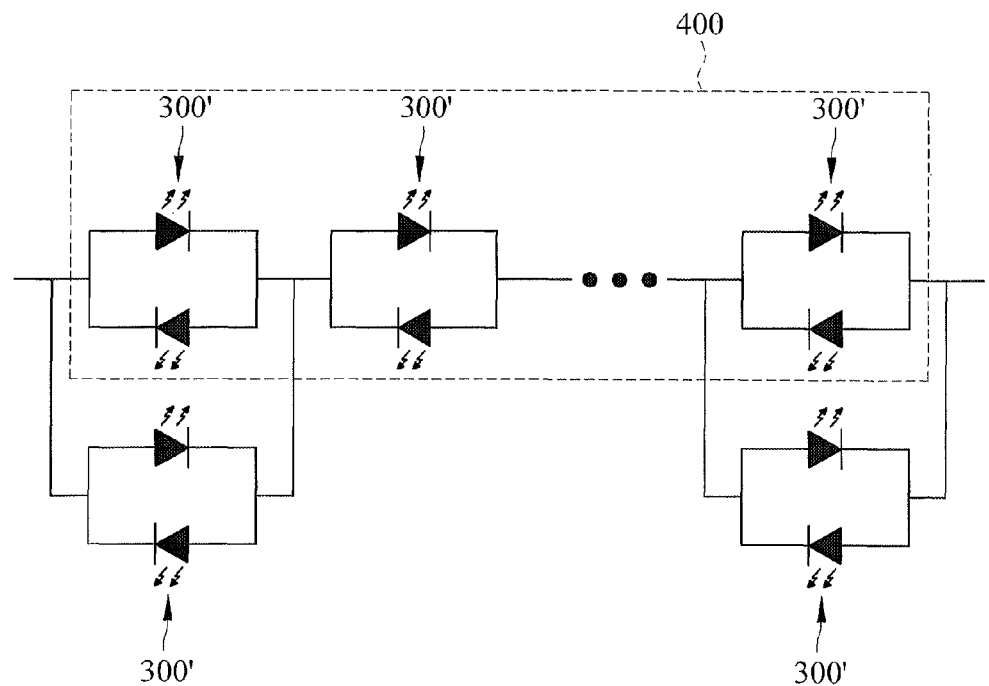
FIG. 2A is a parallel-series connected equivalent circuit diagram in aspect 1 according to an embodiment of the present invention.
Figure 2B:
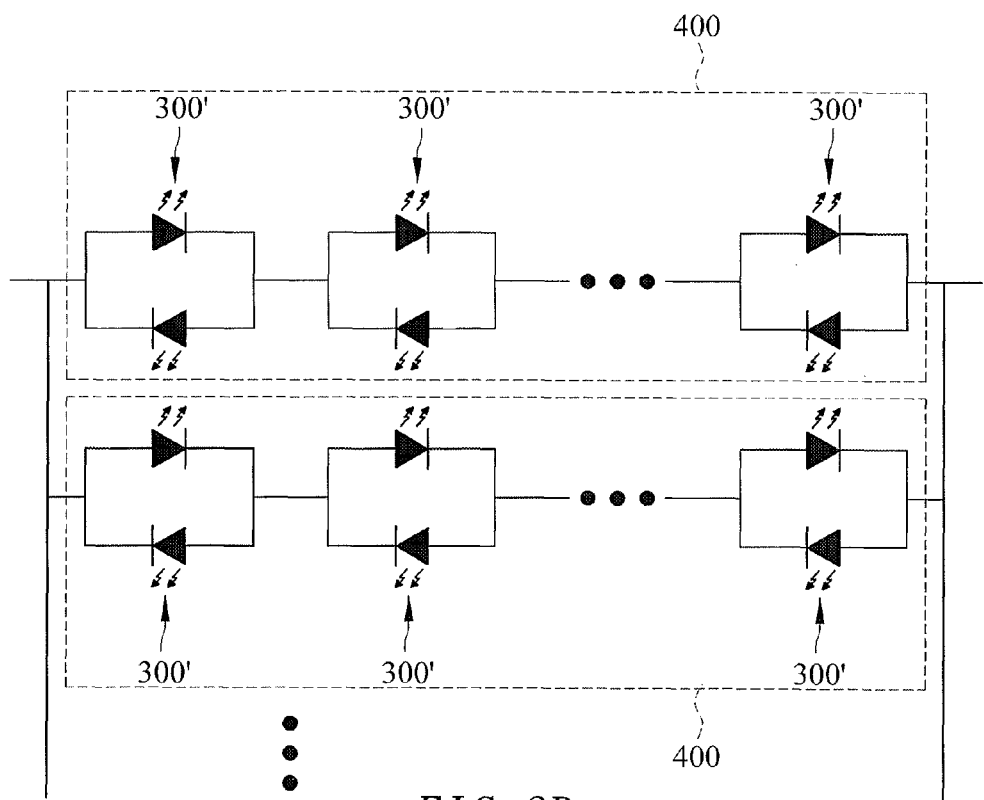
FIG. 2B is a parallel-series connected equivalent circuit diagram in aspect 2 according to an embodiment of the present invention.

Referring to FIG. 2A and FIG. 2B, in addition to the aforesaid basic aspect, it is feasible to connect any two of the AC LED chips 300' in parallel, such that the series-connected circuit 400 further comprises a parallel-connected circuit, or it is feasible for the series-connected circuit 400 to be further parallel-connected with at least one said series-connected circuit 400, so as to form the high-voltage AC LED structure 100 characterized by diversity.

Figure 3:
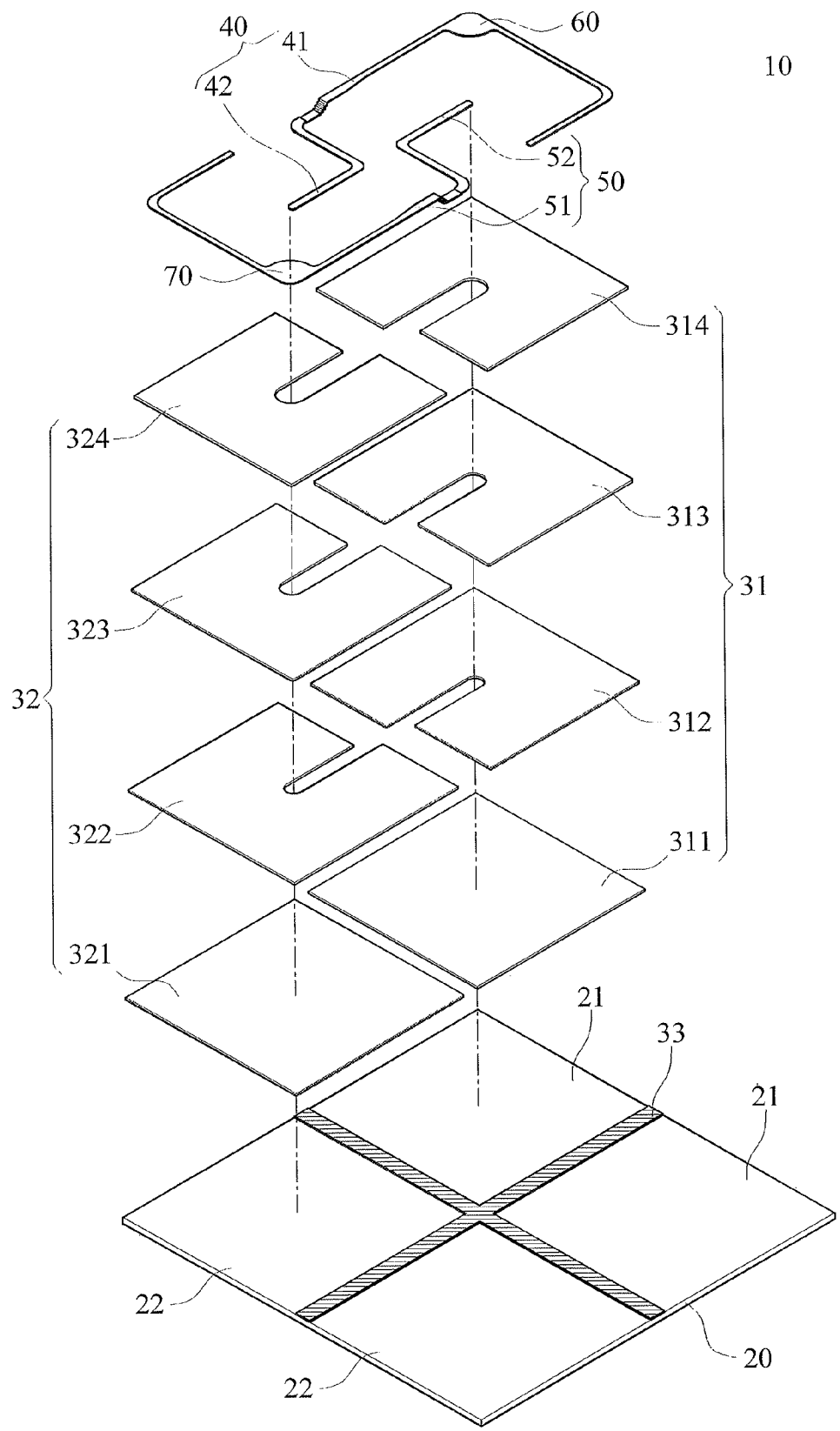
FIG. 3 is a perspective exploded view of an AC LED chip according to an embodiment of the present invention.
Figure 4A:
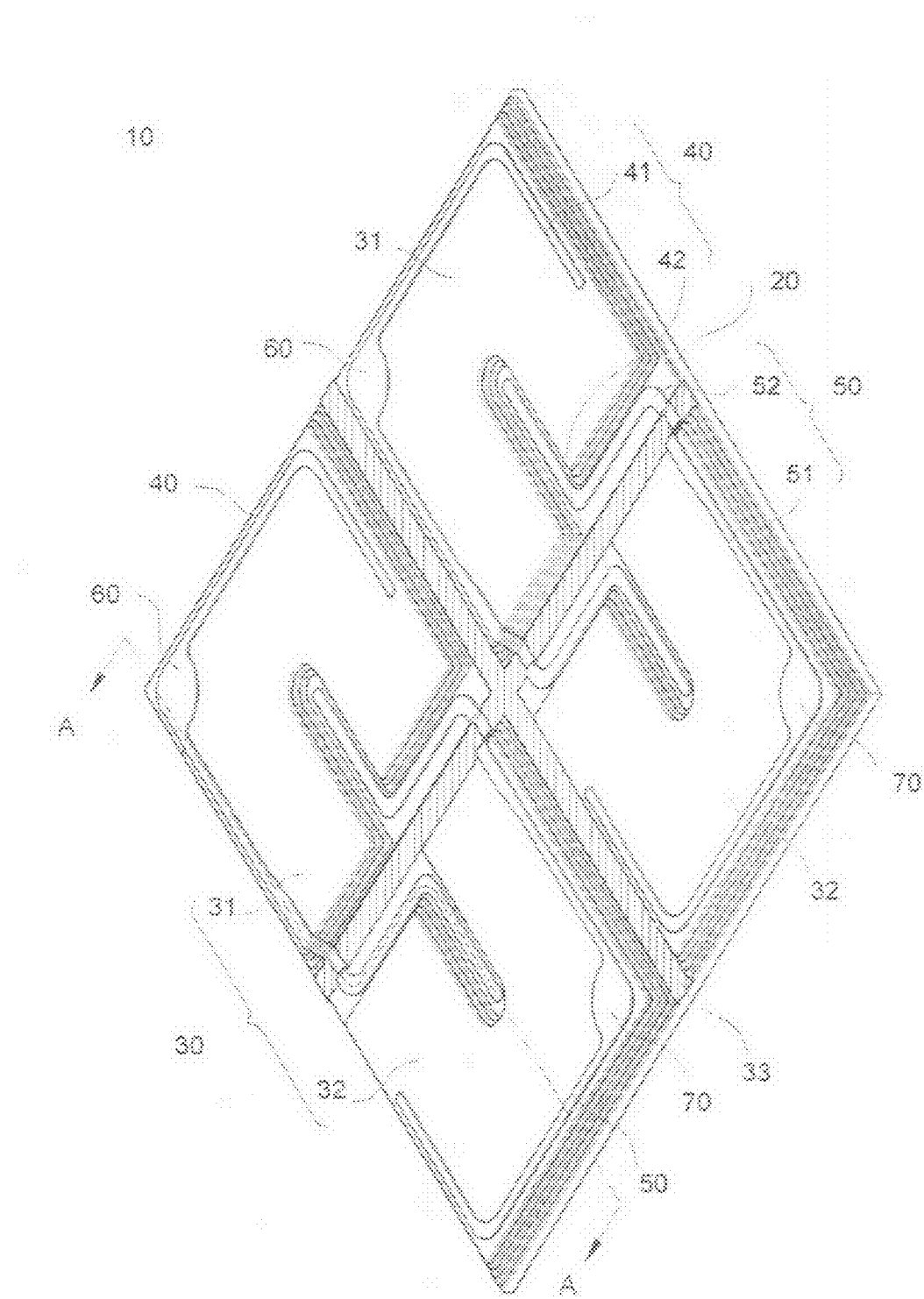
FIG. 4A is a perspective assembled view of an AC LED chip according to an embodiment of the present invention.
Figure 4B:
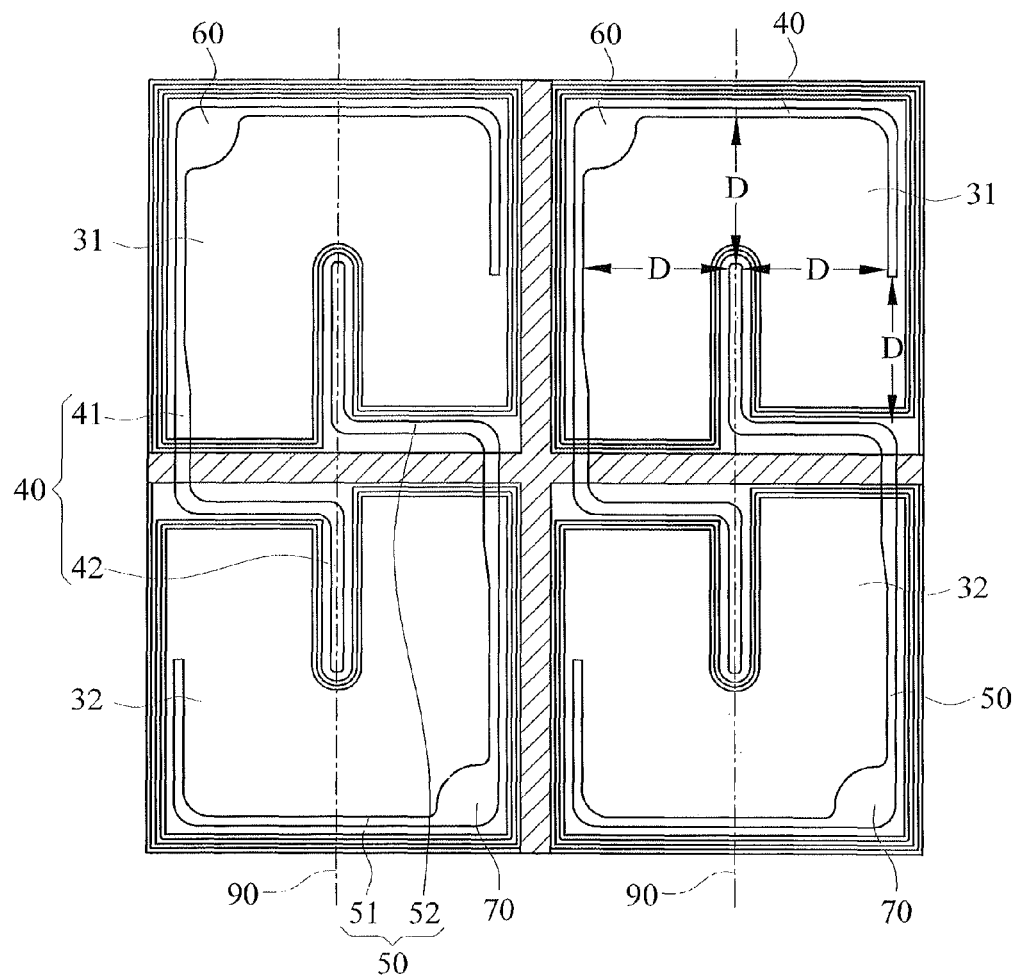
FIG. 4B is a top view of an AC LED chip according to an embodiment of the present invention.
Figure 5:
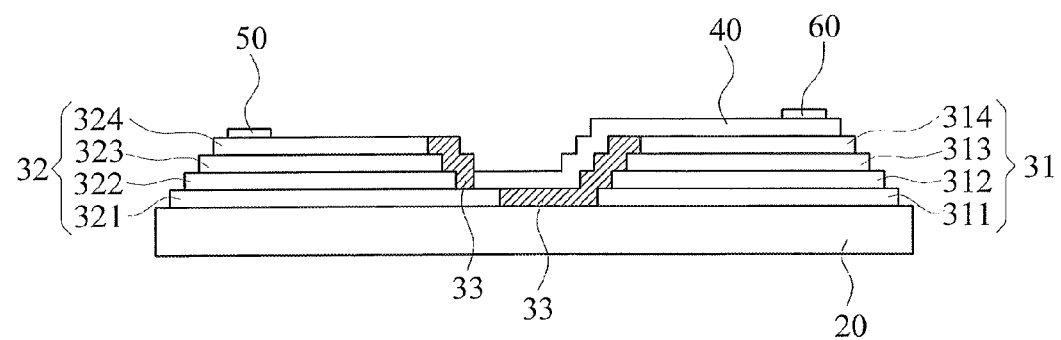
FIG. 5 is a cross-sectional view of an AC LED chip taken along line A-A of FIG. 4A.
Figure 6:
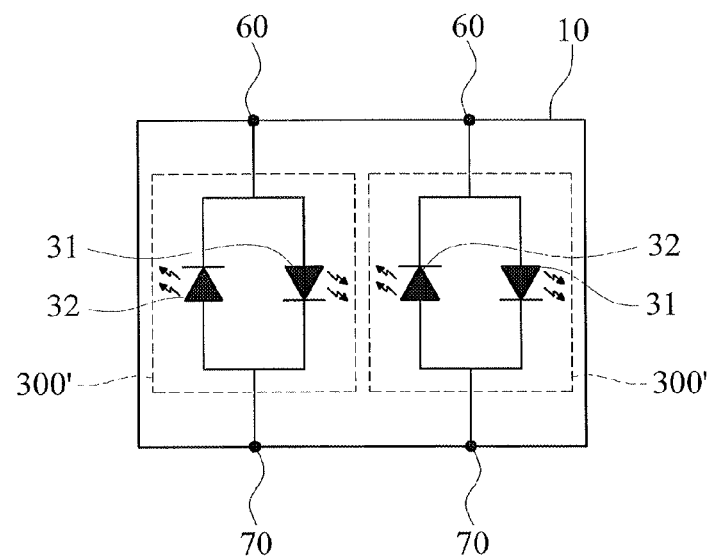
FIG. 6 is an equivalent circuit diagram of an AC LED chip according to an embodiment of the present invention.

Referring to FIG. 3 through FIG. 5, each of the AC LED chips 300 is manufactured by a wafer level process, and each of the AC LED chips 300 comprises an insulated substrate 20, at least one LED set 30, at least one first metal layer 40, and at least one second metal layer 50. Please refer to FIG. 6 for equivalent circuits 300' of the AC LED chips.

The insulated substrate 20 is a sapphire substrate or any other insulated substrate applicable to a light-emitting diode process. The insulated substrate 20 is partitioned to form a plurality of regions for carrying the LED sets 30, respectively.

The LED sets 30 are disposed on the insulated substrate 20. Each of the LED sets 30 has a first LED 31 and a second LED 32. The first LED 31 and the second LED 32 are disposed on the insulated substrate 20 and are insulated and separated from each other. The LED sets 30 are insulated and separated from each other. To insulate the first LED 31 and the second LED 32 from each other completely, an insulating layer 33 is disposed between the first LED 31 and the second LED 32, thereby preventing current leakage.

The first LED 31 comprises a first n-type layer 311, a first active layer 312, a first p-type layer 313, and a first transparent conductive layer 314. Likewise, the second LED 32 comprises a second n-type layer 321, a second active layer 322, a second p-type layer 323, and a second transparent conductive layer 324.

The first n-type layer 311 of the first LED 31 is disposed at a first region 21 on the insulated substrate 20. The second n-type layer 321 of the second LED 32 is disposed at a second region 22 on the insulated substrate 20. The first region 21 and the second region 22 are adjacent to each other, thereby facilitating electrical connection of the first LED 31 and the second LED 32.

The first active layer 312 and the second active layer 322, each of which is U-shaped, meet each other front to front, and are disposed on the first n-type layer 311 and the second n-type layer 321, respectively, in a manner that portions of the first n-type layer 311 and the second n-type layer 321 are exposed from the first active layer 312 and the second active layer 322, respectively.

The first p-type layer 313 and the second p-type layer 323 are disposed on the first active layer 312 and the second active layer 322, respectively. The first transparent conductive layer 314 and the second transparent conductive layer 324 are disposed on the first p-type layer 313 and the second p-type layer 323, respectively. The insulating layer 33 is disposed on the edges of the first n-type layer 311 and the second n-type layer 321, such that the first LED 31 and the second LED 32 are completely insulated.

The first metal layer 40 forms a first shape layout and has a first end portion 41 and a second end portion 42. The first end portion 41 of the first metal layer 40 is disposed on the first transparent conductive layer 314 of the first LED 31. The second end portion 42 of the first metal layer 40 is disposed on the second n-type layer 321 exposed from the second. LED 32.

Likewise, the second metal layer 50 forms a first shape layout and corresponds in position to the first metal layer 40. The second metal layer 50 has a third end portion 51 and a fourth end portion 52. The third end portion 51 of the second metal layer 50 is disposed on the second transparent conductive layer 324 of the second LED 32. The fourth end portion 52 of the second metal layer 50 is disposed on the first n-type layer 311 exposed from the first LED 31. Due to the first metal layer 40 and the second metal layer 50, not only are the first LED 31 and the second LED 32 electrically connected, but the first LED 31 and the second LED 32 are also connected in parallel and inversely.

To prevent a short circuit which might otherwise develop as a result of electrically connecting the first metal layer 40 to the first LED 31 and the second LED 32, it is feasible for the insulating layer 33 to extend to the sidewalls of the first LED 31 and the second LED 32, such that the first LED 31 and the second LED 32 are insulated from the first metal layer 40. Likewise, a short circuit is likely to occur when the second metal layer 50 is electrically connected to the first LED 31 and the second LED 32; hence, it is feasible for the insulating layer 33 to extend to the sidewalls of the first LED 31 and the second LED 32, such that the first LED 31 and the second LED 32 are insulated from the second metal layer 50.

To enable the AC LED chips 300 to be electrically connected to an external circuit 80, the AC LED chips 300 further comprises a first solder pad 60 and a second solder pad 70. The first solder pad 60 is formed on the first end portion 41 of the first metal layer 40. The second solder pad 70 is formed on the third end portion 51 of the second metal layer 50. Alternatively, the first solder pad 60 is formed on the second end portion 42 of the first metal layer 40, whereas the second solder pad 70 is formed on the fourth end portion 52 of the second metal layer 50.

Hence, it is feasible to electrically connect the external circuit 80 to the first solder pad 60 and the second solder pad 70 and input an AC power for placing the first LED 31 and the second LED 32 in an electrical conduction state. However, for example, once the first LED 31 enter the electrical conduction state, the first end portion 41 of the first metal layer 40 functions as a current emitter, whereas the fourth end portion 52 of the second metal layer 50 functions as a current receiver for receiving the current emitted from the first end portion 41 of the first metal layer 40, thereby enabling the first LED 31 to emit light.

To enable the first metal layer 40 and the second metal layer 50 to receive a current efficiently and cause the current to diffuse evenly in the first LED 31 and the second LED 32, the first shape layout formed by the first metal layer 40 and the second metal layer 50 is scooper-shaped, whereas the first metal layer 40 and the second metal layer 50 are disposed at a periphery of the first LED 31 and the second LED 32, so as to increase the light emission area of the first LED 31 and the second LED 32.

Furthermore, an end of the second end portion 42 of the first metal layer 40 and an end of the fourth end portion 52 of the second metal layer 50 are disposed at a central axis 90 of the first LED 31 and the second LED 32, respectively. The distances D between every two adjacent ones of the first metal layers 40 and the second metal layers 50 are equal, such that the distances D for which a current diffuses to the other metal layer are equal. As a result, the current diffuses to the other metal layer at the same speed, and brightens up the first LED 31 and the second LED 32 evenly.

Figure 7:
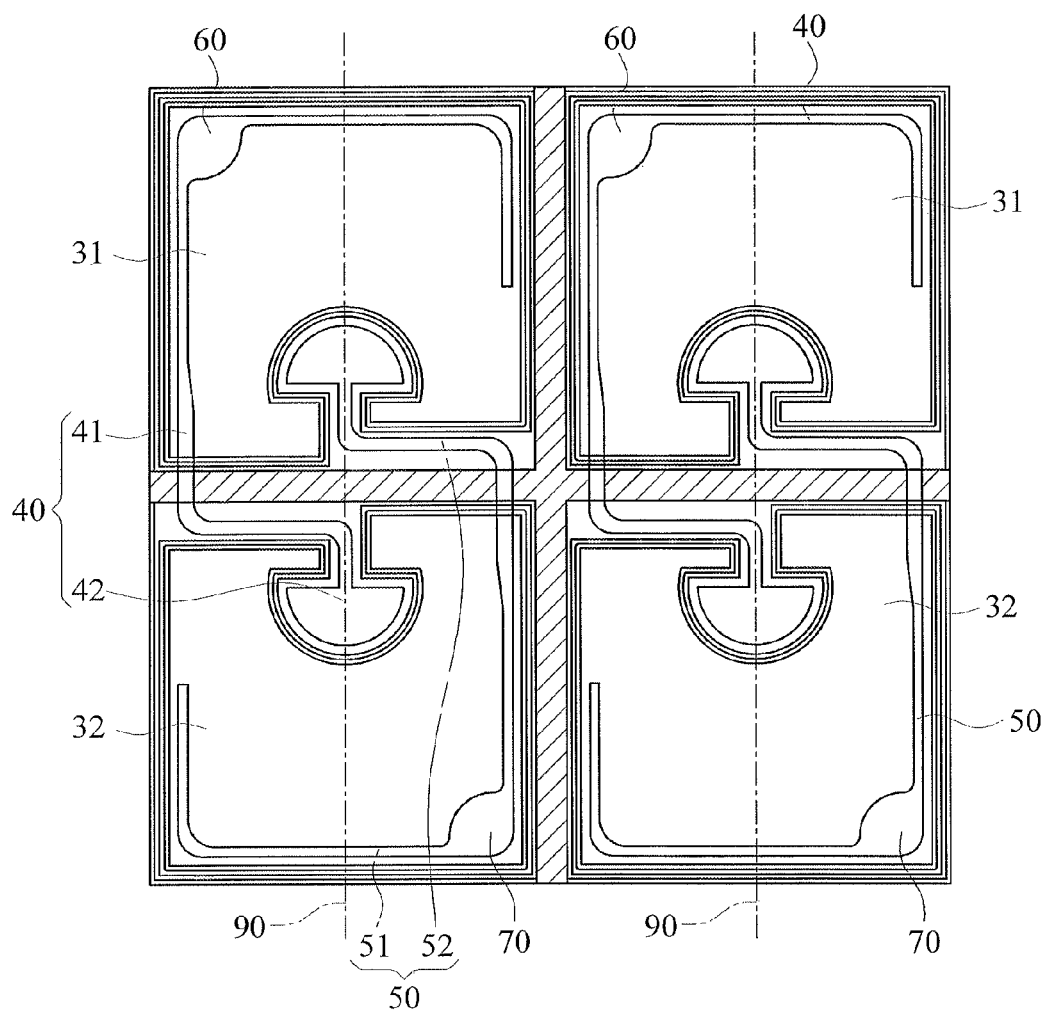
FIG. 7 is a schematic view of a metal layer with semicircular ends according to an embodiment of the present invention.
Figure 8:
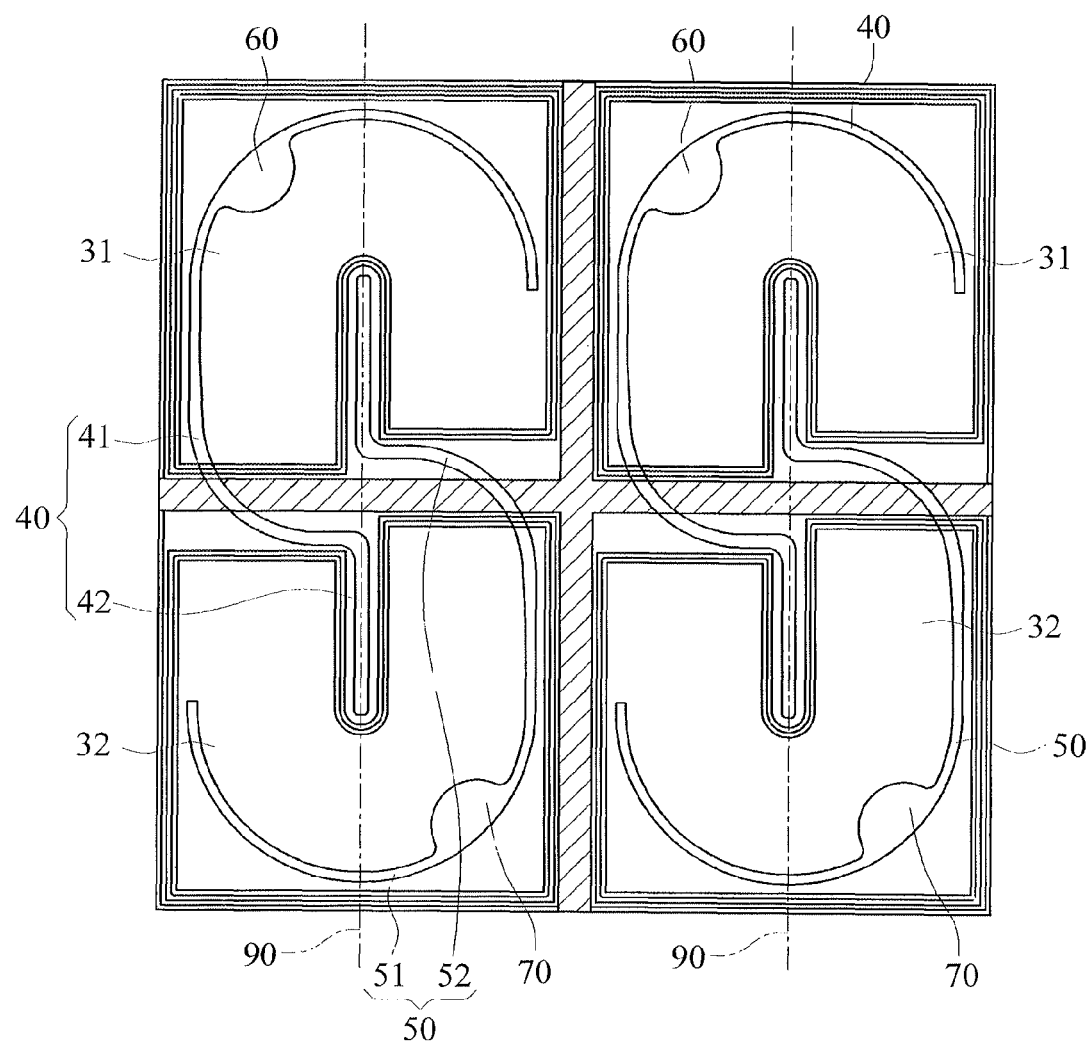
FIG. 8 is a schematic view of a metal layer with half S-shaped ends according to an embodiment of the present invention.
Figure 9:
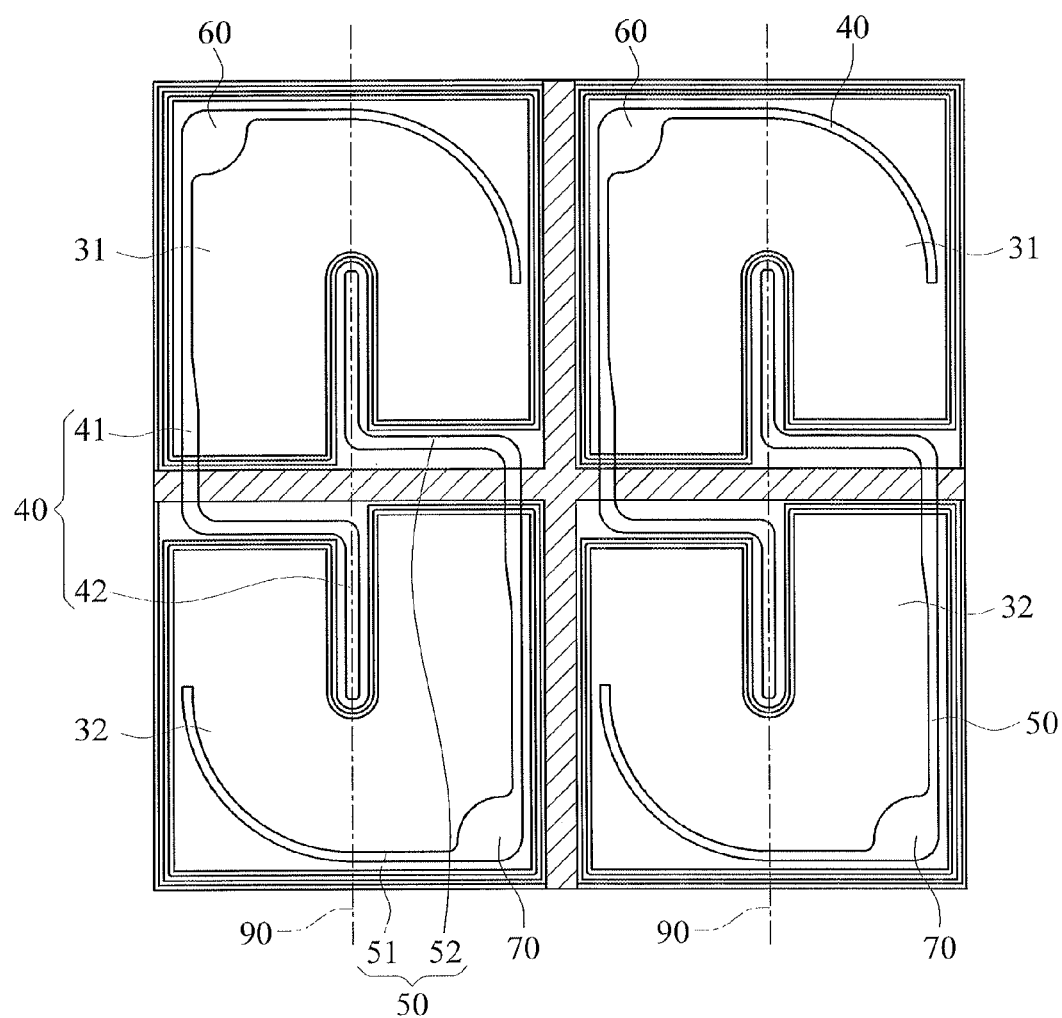
FIG. 9 is a schematic view of a metal layer with a layout of another shape According to an embodiment of the present invention.

Referring to FIG. 7, FIG. 8 and FIG. 9 for the following description. The end of the second end portion 42 of the first metal layer 40 and the end of the fourth end portion 52 of the second metal layer 50 are semicircular as shown in FIG. 7. The first shape layout formed by the first metal layer 40 and the second metal layer 50 is half S-shaped as shown in FIG. 8. The first shape layout is square, circle, or a combination thereof as shown in FIG. 9.

Figure 10A:
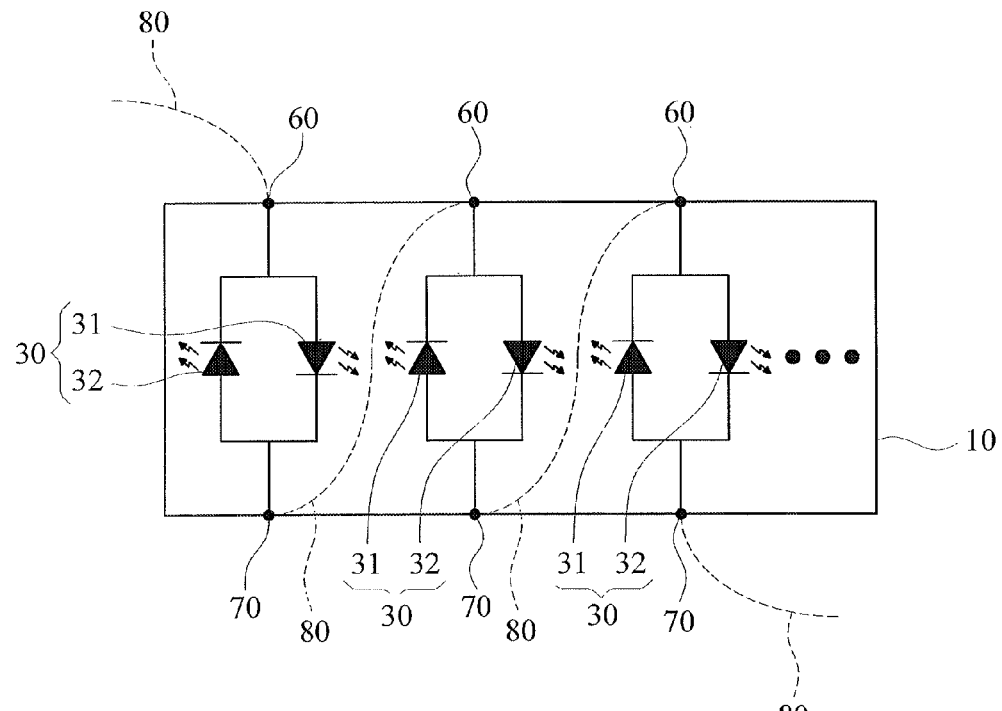
FIG. 10A is an equivalent circuit diagram of an AC LED chip in the first application example according to an embodiment of the present invention.
Figure 10B:
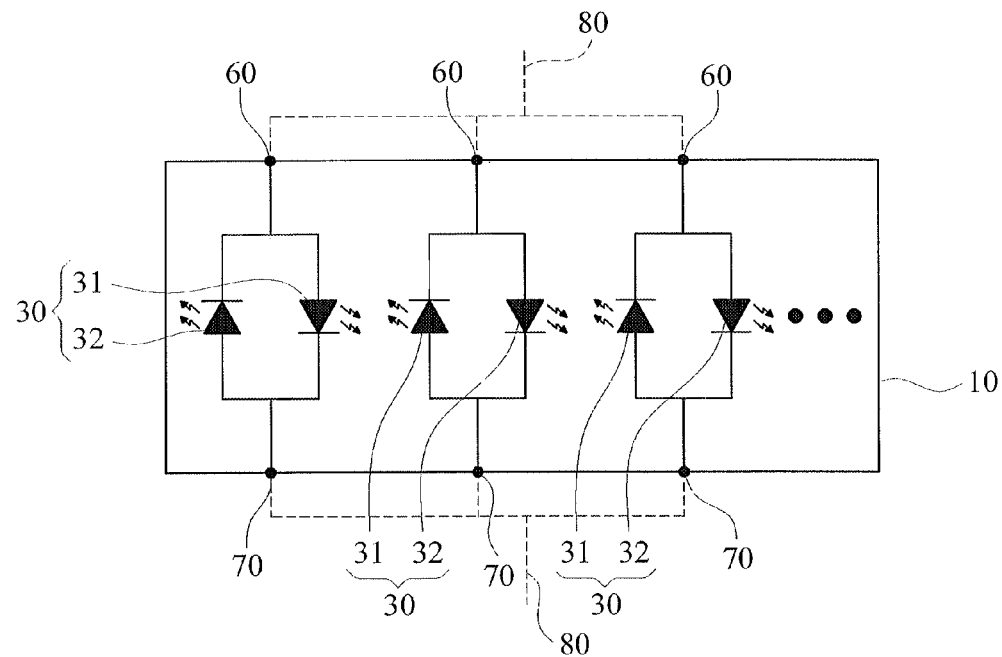
FIG. 10B is an equivalent circuit diagram of an AC LED chip in the second application example according to an embodiment of the present invention.

Referring to FIG. 10A and FIG. 10B, in this embodiment, not only are the LED sets 30 disposed on the insulated substrate 20, but the external circuit 80 enables the AC LED chips 300 to be connected in series or in parallel, such that the AC LED chips 300 can be subjected to high current density or high-voltage operation as needed. Furthermore, internal connection wires are reduced to eliminate redundancy and reflect necessity; hence, the light emission area of the AC LED chips 300 is not hidden by internal connection wires, thereby enhancing the brightness of the AC LED chips 300.

The external circuit 80 is either formed by a wire bonding process directly performed on the AC LED chips 300 or formed from a circuit on the circuit substrate 200, such that the AC LED chips 300 can form a diverse parallel-series connected circuit structure conveniently.

The features of the present invention are disclosed above by the preferred embodiment to allow persons skilled in the art to gain insight into the contents of the present invention and implement the present invention accordingly. The preferred embodiment of the present invention should not be interpreted as restrictive of the scope of present invention. Hence, all equivalent modifications or amendments made to the aforesaid embodiment should fall within the scope of the appended claims.

What is claimed is:

1. A high-voltage alternating current light-emitting diode (AC LED) structure, comprising:
   a circuit substrate; and
   a plurality of AC LED chips fixed to and electrically connected to the circuit substrate and forming a series-connected circuit by means of the circuit substrate, the AC LED chips each comprising:
   an insulated substrate;
   at least one LED set having a first LED and a second LED, wherein the first LED and the second LED are disposed on the insulated substrate and insulated and separated from each other;
   at least one first metal layer forming a first shape layout and having a first end portion and a second end portion, the first end portion being disposed on a first transparent conductive layer of the first LED, and the second end portion being disposed on a second n-type layer of the second LED; and
   at least one second metal layer forming the first shape layout and having a third end portion and a fourth end portion, the third end portion being disposed on a second transparent conductive layer of the second LED, and the fourth end portion being disposed on a first n-type layer of the first LED.

2. The high-voltage AC LED structure of claim 1, wherein the circuit substrate is an aluminum substrate or a ceramic substrate.

3. The high-voltage AC LED structure of claim 2, wherein a plurality of thermally conductive posts or a plurality of electrically conductive posts is disposed inside the ceramic substrate.

4. The high-voltage AC LED structure of claim 1, wherein any two of the AC LED chips are further connected in parallel, such that the series-connected circuit further comprises a parallel-connected circuit.

5. The high-voltage AC LED structure of claim 1, wherein the series-connected circuit is further parallel-connected to at least one said series-connected circuit.

6. The high-voltage AC LED structure of claim 1, wherein the first LED comprises the first n-type layer disposed at a first region on the insulated substrate, a first active layer disposed on a portion of the first n-type layer, a first p-type layer disposed on the first active layer, and the first transparent conductive layer disposed on the first p-type layer; and wherein the second LED comprises the second n-type layer disposed at a second region on the insulated substrate, a second active layer disposed on a portion of the second n-type layer, a second p-type layer disposed on the second active layer, and the second transparent conductive layer disposed on the second p-type layer.

7. The high-voltage AC LED structure of claim 6, wherein the first active layer and the second active layer, each of which is U-shaped, meet each other front to front, and are disposed on the first n-type layer and the second n-type layer, respectively, in a manner that portions of the first n-type layer and the second n-type layer are exposed from the first active layer and the second active layer, respectively.

8. The high-voltage AC LED structure of claim 6, further comprising an insulating layer disposed on edges of the first n-type layer and the second n-type layer.

9. The high-voltage AC LED structure of claim 8, wherein the insulating layer extends to sidewalls of the first LED and the second LED.

10. The high-voltage AC LED structure of claim 1, further comprising a first solder pad and a second solder pad, the first solder pad being formed on the first end portion, and the second solder pad being formed on the third end portion.

11. The high-voltage AC LED structure of claim 1, further comprising a first solder pad and a second solder pad, the first solder pad being formed on the second end portion, and the second solder pad being formed on the fourth end portion.

12. The high-voltage AC LED structure of claim 1, wherein the first metal layer and the second metal layer are disposed at a periphery of the first LED and the second LED.

13. The high-voltage AC LED structure of claim 1, wherein an end of the second end portion and an end of the fourth end portion are disposed at a central axis of the first LED and the second LED, respectively.

* * * * *